United States Patent
Sporn et al.

(10) Patent No.: US 6,337,835 B1
(45) Date of Patent: Jan. 8, 2002

(54) ELECTROMECHANICAL CONVERTER AND METHOD OF PRODUCING SAME

(75) Inventors: Dieter Sporn; Winfried Watzka, both of Wuerzburg; Andreas Schönecker, Freital; Lutz Seffner, Dresden; Kord Pannkoke, Bremen, all of (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/486,633
(22) PCT Filed: Jun. 29, 1999
(86) PCT No.: PCT/DE99/01895
§ 371 Date: Mar. 15, 2000
§ 102(e) Date: Mar. 15, 2000
(87) PCT Pub. No.: WO00/02265
PCT Pub. Date: Jan. 13, 2000

(30) Foreign Application Priority Data

Jun. 30, 1998 (DE) .......................................... 198 29 216

(51) Int. Cl.$^7$ .............................................. H01L 41/08
(52) U.S. Cl. ...................................... 367/159; 367/164
(58) Field of Search ................................ 367/157, 159, 367/164, 169; 310/311

(56) References Cited

U.S. PATENT DOCUMENTS 2,540,194 A  2/1951  Ellett
4,984,222 A  1/1991  Beauducel et al.

FOREIGN PATENT DOCUMENTS

DE    3434729 A1   4/1966
DE    196 24 204 C1  10/1997

OTHER PUBLICATIONS

Article: Incorporation of Piezoelectric Pb(Zr,Ti)O$_3$Fibers into Ceramic/Polymer Composites, Proc, SPIE–Int. Soc. Opt. Eng., vol. 2721, 1996, pp. 240–250.

Article: Piezoelectric Fiber Composites with Interdigitated Electrodes, Journal of Intelligent Material Systems and Structures, vol. 8, 1997, pp. 903–919.

Primary Examiner—Daniel T. Pihulic
(74) Attorney, Agent, or Firm—Breiner & Breiner, L.L.C.

(57) ABSTRACT

The present invention relates to an electromechanical converter, a method of manufacturing same, as well as to a composite system including the electromechanical converter. The inventive electromechanical converter consists of at least one elongate fiber (1) made of a piezoelectric material. At least two electrodes (2) are provided at mutually spaced locations on the fiber (1) for subjecting the fiber to an electrical field. The electrodes (2) are in direct contact with the fiber (1) and enclose the fiber (1) partly or completely. The direct contact between the electrode and the fiber permits the optimum introduction of the electrical field into the fiber such that lower electrical potentials on the electrodes are sufficient for polarising the fiber. Another advantage resides in the aspect that the electrode is in direct contact with the fiber not only at one point but over part of the periphery of the fiber. This results in a further enhancement of the introduction of the electrical field.

19 Claims, 2 Drawing Sheets

ELECTROMECHANICAL CONVERTER AND METHOD OF PRODUCING SAME

Figure 1:
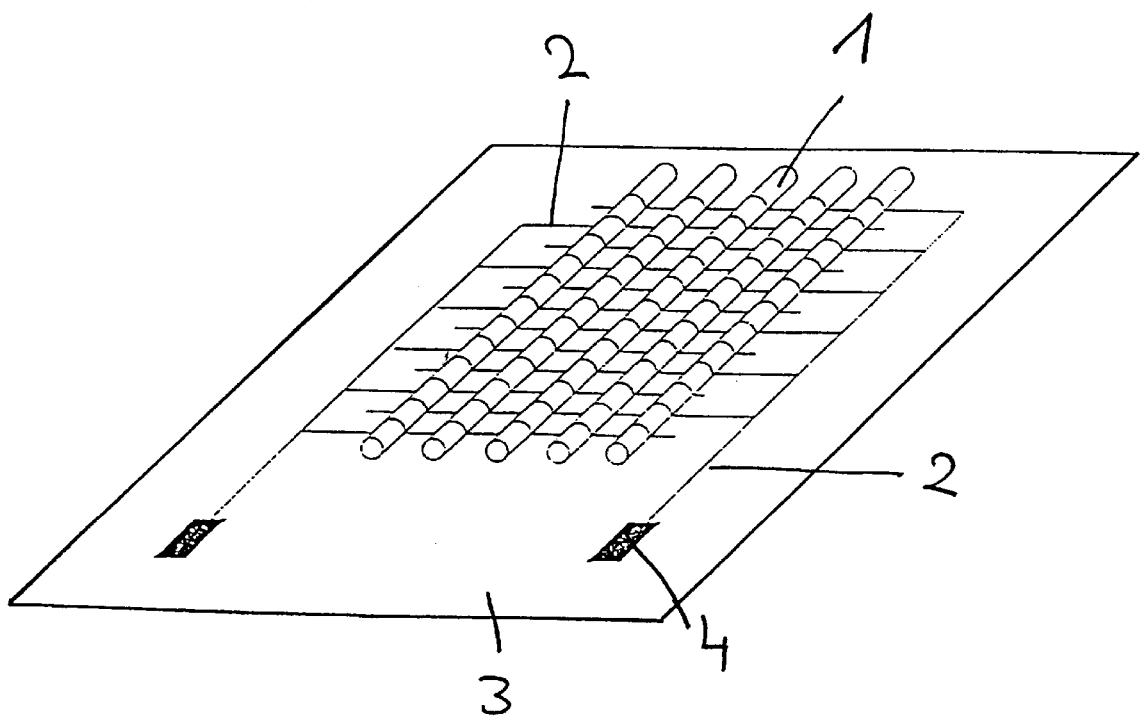

The present invention relates to an electromechanical converter, a method of producing same, as well as to a composite system including the electromechanical converter.

One preferred field of application of the invention is the sphere of adaptive materials. Active materials are able to adapt themselves to varying environmental conditions in a reversible and defined manner if they are controlled via an adaptive circuit. They permit, for instance, the attenuation of vibrations, the reduction of sound, and the control of contours on components. There is a particularly great demand for mechanically loadable composite materials including components having sensor and actor functions.

Electromechanical converters, which operate on the principle of the piezoelectric effect, are especially well suitable for integration into such composite materials. These converters operate as sensitive force or position sensors, and in their actor function they have an outstanding potential for force or displacement generation at a high dynamics level.

In the ideal case, the electromechanical converter should be suitable for integration into the overall structure of a composite material in such a form that the mechanical characteristics of this structure will be impaired at a minimum. Moreover, the converter should be designed for control at the lowest electrical voltage possible.

The purpose of this integration in conformity with the structure, i. e. the minimum interference with the overall structure, can be achieved particularly with the application of fibrous piezoelectric materials and ferro electric ceramic materials in particular.

In the publication by R. E. Newnham, D. P. Skinner, L. E. Cross, in: Mat. Res. Bull., 13 (1978), page 525, the design and manufacture of composite materials is described which are constituted by functional ceramic substances and a polymer matrix. Inter alia, the advantages of composite materials containing fibers or tiny rods of ferro electrical ceramic material, are computed and verified (cf., for instance, R. E. Newnham, A. Safari, J. Giniewicz, B. H. Fox, "Ferro-Electrics", 60 (1984), pages 15 to 21). In these publications the composite materials consist of thin platelets, approximately 1 mm thick, in which the fibers are oriented in a direction orthogonal on the surface or face. The fibers are polarised and controlled there by electroding the faces.

Ferro-electric materials require electrical fields of a defined magnitude for polarising, which is necessary in order to achieve the piezoelectric characteristics. Polarisation is effected between two electrodes spaced by a distance d and with the application of an electrical potential U. The resulting electrical field $E=U/d$ decreases as the spacing d of the electrodes increases. Therefore, fibers of major length cannot be polarised by electroding their ends because the necessary polarisation fields of up to 6 kV/mm cannot be achieved in practical operation even if the fiber lengths are as short as some millimeters. The polarisation of long fibers, i. e. of fibers having a length of one or more centimeters, onwards in the longitudinal direction is therefore impossible with two electrodes on the faces in a conventional discontinuous polarisation step because the necessary electrical fields would require voltages higher than 100 kV.

In the publication "Active Fiber Composites for Structural Actuation" by A. A. Bent, Ph. D. Thesis, MIT, January 1997, a technique is described which is suitable for polarising fibers of major length in the longitudinal direction. To this end electrodes are applied at defined distances along the longitudinal axis of the fibers for controlling the fibers by sections. The electrodes are connected to positive and negative potential in alternation. In this manner it is possible to achieve the electrical fields, which are required in the fibers for polarisation, by electrical voltages which are by far lower than in the case where the fibers ought to be polarised and controlled as a complete unit via their faces in the longitudinal direction. For the combination of this system the electrodes are initially applied in a structured form on Kapton layers. This is performed by applying a silver ink by means of the so-called screen printing technique. The fibers are arranged between these Kapton layers which establish the adhesive connection with the fibers. In the finished converter hence an arrangement is present in which the fibers are embedded between two Kapton layers on which a respective planar electrode structure is disposed.

Such an arrangement presents, however, the disadvantage that despite the realisable small distances between the individual electrodes still comparatively high voltages are required for polarising the individual fiber sections.

The present invention is therefore based on the problem of providing an electromechanical converter as well as methods of producing same, which is suitable for being integrated into a composite system and permits the polarisation and control with low electrical potentials.

This problem is solved with an electromechanical converter according to claim 1 as well as the methods according to claims 13 and 14. Expedient improvements of the invention are the subject matters of the dependent claims.

The inventive electromechanical converter consists of at least one elongate fiber or a thin small rod, respectively, consisting of a piezoelectric material. At mutually spaced locations on the fiber at least two electrodes are provided for applying an electrical field on the fiber. The electrodes are directly contacted with the fiber and enclose the fiber at least partly. The term "direct contact" must be understood here to denote also the case that any further layer, e. g. a dielectric layer, is not present between the electrode and the fiber.

On account of this direct contact between the electrode and the fiber the optimum introduction of the electrical field in the fiber becomes possible so that lower electrical potentials on the electrodes are sufficient for polarising the fiber. Another advantage of the inventive structure consists in the aspect that the electrode is in direct contact with the fiber not at only at one point but over part of the periphery of the fiber. As a result, the introduction of the electrical field is further enhanced.

The electrodes are preferably made of a conductive adhesive. This material can be easily applied, adheres to the fiber, stabilises the latter mechanically, and when the fiber is contacted it results automatically in a partial enclosure of the fiber.

Another improvement of the electromechanical converter is achieved by the provision that the individual electrodes enclose the fiber completely. In this case the electrodes constitute annular electrodes around the fiber.

The electromechanical converter preferably comprises fibers having a diameter of less than 100 $\mu$m and a length of 5 to 100 mm.

In a preferred embodiment, several of these fibers are disposed in parallel with each other (mono ply) and are contacted by electrodes in inter-digital geometry, which extend transversely with respect to the longitudinal axis of the fibers.

An essential feature of the inventive converter consists in the direct contact of the conductive material with the fiber.

As a result, the potential required for establishing a defined field intensity in the fiber is reduced substantially already. Moreover, owing to the at least partial enclosure of the fiber (with direct contact) a further improvement of the introduction of the field intensity and hence a reduction of the necessary electrical potentials is achieved. What is particularly expedient for manufacture is the use of a conductive adhesive for forming the electrodes.

In a preferred embodiment of the invention long ferroelectric fibers are disposed in parallel with each other for forming a mono ply. The fibers are polarised and controlled by the provision that the electrodes are applied at short distances along their longitudinal axis, as is proposed, for instance, in A. A. Bent, "Active Fiber Composites for Structural Actuation", Ph. D. Thesis, MIT, January 1997. These electrodes are connected to positive and negative potential in alternation. Hence the electrical fields, which are required in the fibers for polarisation, can be achieved by low electrical potentials.

The inventive concept of electroding is preferably implemented by parallel strips of a conductive adhesive, which extend in a direction orthogonal on the alignment of the mono ply of parallel fibers. For the provision of large converter areas it is possible to dispose several converters of the inventive structure in side-by-side relationship.

For the integration of the inventive converter with the piezo fibers into a laminated composite material further layers of the composite material are laminated above and below the active single layer.

With such a composite material a number of application fields opens up in the most different branches in industry. Making use of the direct piezo effect it is possible to detect the damage to composite structures without interference with the structure of the composite material by the sensors, i. e. the inventive electromechanical converter(s). Due to the inverse piezo effect the converters as active composites are able to change the geometry of component parts made of composite materials. The composites are capable of attenuating a mechanical vibration actively by the generation of a counter wave or passively by shorting the voltages generated with the piezo effect.

In this respect further improvements can be achieved by the provisions which will be described in the following and which constitute further embodiments of the invention.

With the reduction of the spacing between the electrodes, i. e. the comb or inter-digital electrodes, respectively, to a value lower than 100 μm the potentials required for polarising and controlling the fibers are further reduced.

For an integration of the electromechanical converter in conformity with the structure the functional fibers have a diameter by far less than 100 μm, preferably of less than 30 μm. When integrated into a composite fibrous material they present a minimum structural interference only with such dimensions whilst they are suitable for being bent without occurrence of high mechanical momenta.

The fibers are furthermore embedded only in a very thin single composite layer, such as a polymer layer, which in its turn may then be integrated into the overall composite material so as to achieve conformity with the structure.

With the inventive methods it is possible to achieve composite layers of less than 200 μm in thickness, an electrode spacing of less than 100 μm, and a parallel fiber deposition of more than 100 fibers per centimeter in a side-by-side relationship. When ferro-electric ceramic fibers are employed as functional fibers it is possible to polarise them and to use them then as pressure sensors detecting forces of less than 1 N; they can also be excited to oscillate by means of an alternating electrical field and they are suitable to attenuate mechanical vibrations introduced from the outside either actively (in combination with an adaptive circuit) or passively.

Preferably PZT fibers are used as piezoelectric or functional fibers. These fibers can be produced by methods such as those described in the German Patents DE 43 32 831 or DE 196 35 748.

The inventive electromechanical converter is, of course, not restricted to the preferred application of composite materials. It is also possible, for instance, to use an electromechanical converter comprising a single fiber as actor or sensor in micro technology.

Figure 2A:
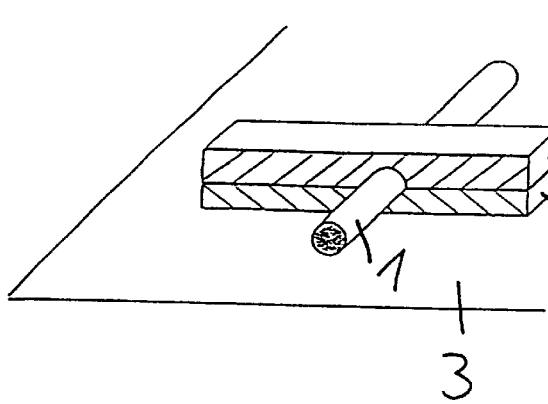
Figure 2B:
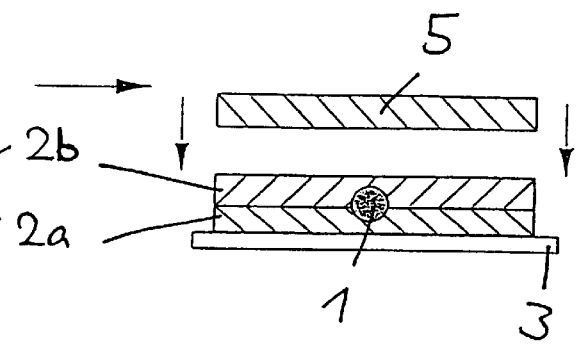
Figure 3:
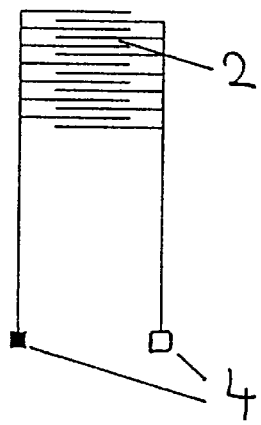

The present invention will now be described in more details in the following by the example of the embodiments, with reference to the drawing wherein: FIG. 1 is a schematic view of one example of an inventive converter; FIG. 2a shows an example of electroding a region on a single fiber in accordance with the invention; FIG. 2b illustrates an example of the application of a further layer on the fiber according to FIG. 2a; and FIG. 3 is a schematic illustration of the geometry of an electrode structure in one embodiment of the invention.

A method of manufacturing composite materials including the inventive electromechanical converter with controllable piezoelectric fibers, e. g. PZT fibers, is subdivided into the production and application of the electrode structure, the production of the fiber ply, the deposition of the fibers on the electrodes or the electrodes on the fibers, the casting and lamination of this structural element, and the final polarisation of the fibers in the structure.

FIG. 1 is a schematic view of one example of an inventive converter. In this embodiment five fibers (1) are arranged in parallel on a substrate (3). The fibers are contacted along their longitudinal axis at mutually spaced locations by electrodes which are arranged in inter-digital geometry. The electrodes have a direct contact with the fibers and enclose the individual fibers partly, as can be clearly seen in the Figure. The electrical connection of the system is made via the two terminal pads (4) of the electrodes.

FIG. 2a shows one example of electroding a region on a single fiber (1). In this embodiment, the electrode structure (2) consists of a first ply or layer (2a) and a second ply (2b) superimposed thereon. The second ply is an optional provision here. Whilst the fiber is partly embedded in the first ply, so that the fiber is enclosed by half by the electrode, the second ply permits the complete enclosure of the fiber. In this manner an annular electrode is formed which encloses the fiber.

One example of a method of manufacturing the inventive electromechanical converter will be explained in the following with reference to FIG. 2. The structure of the lower electrodes (2a), e. g. an inter-digital structure as shown in FIG. 3, is introduced as negative pattern into a thin master. In a doctoring step performed with a conductive adhesive the electrode tracks (2) are doctored via the negative master onto a substrate (3). The substrate may consist, for instance, of a carrier layer or the composite material as such into which the converter is to be integrated.

A thixotropic epoxy resin is preferably used as conductive adhesive, which contains metal particles (e. g. Ag). This adhesive can be easily applied under pressure into the negative master, on the one hand, and, on the other hand, it will not flow further when the master is removed, with straight side surfaces being maintained. Prior to the application of the fibers (1) onto this structure the adhesive can be allowed to start setting to an extent that it will not flow even under pressure but will yet present still the necessary adhesiveness for adherence of the fibers thereto. The initial setting or hardening is performed in an approach to prevent the adhesive from penetrating into capillaries which may occur between the fibers and the substrate in the ongoing process. It is preferably performed at elevated temperatures. The fibers (1) are then applied onto the electrodes (2a). Subsequently, the electrodes are completely hardened. Now the structure can be cast, e.g. by application of a resin (5).

An improvement of the properties of the converter is achieved when prior to casting additionally another electrode layer (2b) is applied onto the fibers, which is largely congruent with the first electrode layer (2a). This structure is regularly so distributed over the fibers, using a dispenser suitable for processing a conductive adhesive, that each of these fibers will be completely surrounded by the electrode at the points of intersection of the electrode tracks with the fibers. In this case a conductive adhesive is preferably used which has a viscosity lower than that of the adhesive used for the lower electrode layer (2a). After application of the structure this adhesive is hardened, too. Then this structure can equally be cast with a resin (5), as is shown in FIG. 2b.

In another exemplary method of manufacturing one embodiment of the inventive converter the fibers are initially disposed in parallel and cast or sealed in a polymer. Subsequently, the structure for the electrodes (2) is locally removed in the polymer layer by means of a laser until the surface of the fibers is exposed. The wavelength and the energy of the laser must be so set that the synthetic material will be removed without any damage to the fibers. After the formation of the structure on one side the electrode system is produced by filling the recesses. To this end preferably a conductive adhesive is used. The use of other materials is equally possible, of course, e. g. by vapour deposition of a metal on the fibers. When the electrodes are intended to enclose each of the fibers completely the steps of removal by laser and filling are repeated for the opposite side of the polymer layer.

The fibers, which are preferably ferro-electric fibers and used for a flat composite material, are PZT fibers, for instance, of the type described in the German Patents DE 43 32 831 or DE 196 35 748. These fibers are produced in a wet chemical process, a sol-gel method, and converted into ceramic fibers by thermal steps of operation.

The fibers are preferably electroded as a mono ply, which means that they are arranged in parallel without any fibers being laid on top of each other. In order to achieve this arrangement the fibers are either produced as mono filaments or as multi-filament fibers (cf. German Patent DE 196 35 748) and subsequently introduced into a mono ply, or they are manufactured as mono ply already in the beginning.

Another possibility of obtaining a mono ply of PZT fibers consists in an approach in which the fibers are already disposed in a ply of parallel fibers in a spinning operation in which they are still present at the sol-gel stage, whilst the fibers do largely not cover or intersect with each other. In the subsequent steps of drying, pyrolysis and sintering the fibers must possibly be subjected to a thermal treatment on different substrates, which requires the transfer of the fibers by lifting. As the majority of functional fibers is highly fragile a gentle technique should be employed for transferring the fibers to another substrate without any interference with their parallel arrangement. This may be done, for instance, by means of a vacuum suction technique.

The application of the fibers on the electrode structure or of the electrode structure on the fibers can be implemented with various methods.

For instance, a substrate layer with the electrodes consisting of a still wet conductive adhesive may be lowered onto the fiber ply. When a defined pressure is exerted onto the electrode structure the fibers are then pressed into the adhesive.

Another potential technique is the application of single fibers onto the electrode structure in succession. This may be done by hand or with the provision that the fibers drop from above onto the electrode strips through a slot extending orthogonally on these strips. When the slot is moved in a direction orthogonal on the electrode strips the fibers are deposited in succession and in parallel with each other.

For the integration into a composite material the fibers electroded on one side or on all sides are preferably sealed or cast with a polymer. To this end an epoxy resin is preferably used, which is largely similar to the matrix material of the composite material.

This layer may be coated with any number of further individual lamination layers which in their turn may include PZT fiber structures.

When the fibers are electroded after embedding in a polymer, as is the case in the second aforedescribed method, the polymer layer with the fibers may be laminated directly into the composite material.

When the converter is used a potential is applied by a an electronic control system or a measuring circuit to the exterior terminals (4) which are not covered by the polymer material when the system is cast, which potential causes the polarisation of the fibers, preferably at an elevated temperature, in the structure. The fibers are also controlled for their sensor or actor functions via the terminals (4), too.

With a multiple arrangement of the inventive converter within the composite structure, e. g. in a side-by-side relationship or in a stacked system, vibrations can be selectively excited by controlling the converters with a phase delay.

What is claimed is:

1. An electromechanical converter comprising at least one elongate fiber made of a piezoelectric material and at least two electrodes provided at mutually spaced locations on the fiber for subjecting the fiber to an electrical field in a longitudinal direction, wherein said electrodes are in direct contact with said fiber, with individual electrodes enclosing the fiber at least partly.

2. An electromechanical converter according to claim 1, wherein said electrodes are made of an electrically conductive adhesive.

3. An electromechanical converter according to claim 1 or 2, wherein the individual electrodes enclose said fiber completely.

4. An electromechanical converter according to claim 1 or 2, wherein said fiber has a diameter of less than 100 $\mu$m.

5. An electromechanical converter according to claim 1 or 2, wherein said fiber has a length of 5 to 100 mm.

6. An electromechanical converter according to claim 1 or 2, wherein a plurality of said electrodes is disposed in inter-digital geometry along the longitudinal axis of said fiber.

7. An electromechanical converter according to claim 1, wherein a plurality of said fibers is disposed in parallel side-by-side relationship so as to form a mono ply of fibers.

8. An electromechanical converter according to claim 7, wherein a plurality of mono plies of said fibers are disposed one on top of another.

9. An electromechanical converter according to claim 7 or 8, wherein layers of other materials are joined above and/or below said mono ply or plies.

10. An electromechanical converter according to claim 1 or 2, wherein said fibers are embedded in a polymer layer.

11. An electromechanical converter according to claim 1 or 2, wherein said piezoelectric material is a ferro-electric ceramic material.

12. A composite material consisting of a plurality of layers, wherein at least one of said layers includes the electromechanical converter according to claim 1 or 2.

13. A method of manufacturing an electro-mechanical converter, comprising steps as follows:

provided one or several elongate fibers made of a piezoelectric material;

depositing said fiber(s) on a substrate layer; and depositing an electrically conductive material for forming electrodes on at least two mutually spaced locations directly on said fiber(s) such that said conductive material will be in direct contact with said fiber(s), enclosing said fiber(s) at least partly and that an adhesive connection will be established between said fiber(s) and said conductive material.

14. A method of manufacturing an electro-mechanical converter, comprising steps as follows:

providing one or several elongate fibers made of a piezoelectric material;

depositing an electrically conductive material for forming electrodes on at least two mutually spaced locations on a substrate layer;

depositing said fiber(s) directly on said conductive material such that said conductive material will be in direct contact with said fiber(s), enclosing said fiber(s) at least partly and that an adhesive connection will be established between said fiber(s) and said conductive material.

15. A method according to claim 14, wherein said conductive material is also applied directly on said fiber(s) at locations where said fiber(s) is(are) already enclosed partly by conductive material so that said conductive material will completely enclose said fiber(s).

16. A method according to claim 14 or 15, wherein prior to the application of said conductive material a negative pattern is applied for determining an inter-digital geometry of said electrodes on said substrate layer, with said conductive material being introduced into said negative pattern.

17. A method according to claim 13 or 14, wherein said conductive material is an electrically conductive adhesive.

18. A method according to claim 13 or 14, wherein said substrate layer with still wet conductive adhesive is lowered onto said fibers, with said fibers being pressed into said adhesive.

19. A method according to claim 13 or 14, wherein said substrate layer is part of a composite material into which the electromechanical converter is to be integrated.

* * * * *